United States Patent [19]

Tanjyo et al.

[11] Patent Number: 5,189,303

[45] Date of Patent: Feb. 23, 1993

[54] ION SOURCE HAVING A MASS SEPARATION DEVICE

[75] Inventors: Masayasu Tanjyo; Hiroshi Nakazato, both of Kyoto, Japan

[73] Assignee: Nissin Electric Co., Ltd., Kyoto, Japan

[21] Appl. No.: 838,926

[22] Filed: Feb. 21, 1992

[30] Foreign Application Priority Data

Jul. 23, 1991 [JP] Japan .................................. 3-207590

[51] Int. Cl.$^5$ ......................... H01J 49/32; H01J 37/08
[52] U.S. Cl. .................................. 250/296; 250/423 R; 315/111.81; 315/111.41; 315/111.31
[58] Field of Search ........... 250/296, 396 R, 396 ML, 250/423 R; 315/111.81, 111.41, 111.31

[56] References Cited

U.S. PATENT DOCUMENTS

| | | | |
|---|---|---|---|
| 4,486,665 | 12/1984 | Leung et al. | 250/423 R |
| 5,030,885 | 7/1991 | Holmes | 315/111.81 |

FOREIGN PATENT DOCUMENTS

| | | | |
|---|---|---|---|
| 63-32835 | 2/1988 | Japan | 250/423 R |
| 1503422 | 5/1988 | Japan | . |
| 2201855 | 1/1989 | Japan | . |

OTHER PUBLICATIONS

E. Leal-Quiros, et al. "Focused high-intensity proton beam from a lithium source by using an E X B stigmatic selector" Rev. Sci. Instrum. 61 (1) pp. 636-638 (1990).

*Primary Examiner*—Jack I. Berman
*Attorney, Agent, or Firm*—Cushman, Darby & Cushman

[57] ABSTRACT

An ion source for producing wide, large area type ion beams with a mass-separation device. Four, five six or so electrode plates with ion holes at the same positions are installed at the outlet of the ion source. Second or third one of the electrodes has Wien filters at the ion holes. The Wien filter has permanent magnets and electrodes for producing a magnetic field and an electric field perpendicular to the axial direction of the ion holes. Ion beams which have not been accelerated so fast are separated by mass by the Wien filter. Low kinetic energy of ions alleviates the strength of the magnetic field and the electric field. Wide, large area type ion beams without impurities are obtained.

18 Claims, 8 Drawing Sheets

ION SOURCE HAVING A MASS SEPARATION DEVICE

FIELD OF THE INVENTION

This invention relates to a large area type ion source having a mass separation device. An ion source is a device which converts a gas introduced into a vacuum chamber into plasma and makes ion beams by pulling ions out.

BACKGROUND OF THE INVENTION

Ion sources have been used for various purposes in various fields of technology, e.g. for doping impurities into semiconductor devices, liquid crystal TFT or solar cells, for etching objects by ion beams, for cutting or polishing by ion sputtering, for depositing thin films by ion beams, for improving the quality of objects or for processing objects on some purpose.

Narrow ion beams with small diameter have also been utilized. In general, narrow ion beams have been used more frequently for measuring properties of objects than for processing or treating objects, because narrow ion beams are inconvenient to process or treat objects with high yield.

In the case of narrow ion beams, it is easy to mount a mass separation device at a point of a passage of ion beams. A mass separation device is a device which bends the paths of ion beams by magnets into curved paths with different curvatures, distinguishes ions by the difference of mass and permits the ions with predetermined mass to pass through the device. Such ion sources that produce narrow ion beams are called here zero-dimension type.

However, if the purpose of an ion source is to process objects, wide ion beams are more convenient than narrow ones, because many more objects can be processed in the same process time. The ion sources that can produce wide ion beams are now called large area type.

In the case of wide ion beams, it is difficult to separate ions by mass. Wide diameter hinders the mass separation of ion beams. Theoretically, big magnets could separate ions by mass effectively even for wide ion beams. Because of high kinetic energy and wide diameter of ion beams, mass separation has hardly been done for large area type ion sources which generate wide ion beams.

In general, ion beams have energy as large as 10 keV to 200 keV at an outlet of an ion source. In the case of large area type ion sources, the diameter of ion beams is wide. Bending these wide, strong ion beams would require a large, strong magnet with strong magnetic flux. The diameter of the poles of the magnet must be far larger than that of ion beams. Furthermore, the magnet must have an arc shape which coincides with the curvature of bent ion beams.

It is uneasy to manufacture such a huge, strong magnet. It is still difficult to mount the big magnet at the outlet of an ion source.

By these reasons, conventional large area type ion sources have rarely been equipped with mass separation device so far.

Large area type ion sources which generate wide beams are used for finishing, processing or improving objects or for doping objects with impurity. It is preferable that the ions bombarding objects are restricted to a certain kind of ions which have a definite mass. However, various kinds of ions are excited in an ion source. Without a mass separation device, undesirable ions are not eliminated. Such undesirable ions also bombard objects, which would bring about some inconvenience. Therefore, large area type ion sources also require a mass separation device.

However, conventional mass separation devices which would bend the passage of ion beams by a big magnet with a pair of wide pole pieces would be unpractical because of the huge size of the magnet. A purpose of this invention is to provide a large area type ion source with a mass separation device without increasing the size of an ion source. Another purpose of the invention is to provide a large area type ion source with a mass separation device which works under weak magnetic field and low electric field.

SUMMARY OF THE INVENTION

This invention proposes an ion source having a mass separation device comprising an ion source chamber having a gas inlet and an outlet and being able to be made vacuum for introducing material gas therein and for exciting the material gas into plasma, a plasma electrode plate with plural holes perforated perpendicularly to a surface mounted at the outlet of the ion source chamber for producing ion beams from the plasma in the ion source chamber, an extraction electrode plate with plural holes corresponding to the holes of the plasma electrode plate mounted next to the plasma electrode plate at the outlet of the ion source chamber for extracting ion beams forward, an acceleration electrode plate with plural holes corresponding to the holes of the extraction electrode plate mounted next to the extraction electrode plate in the outlet of the chamber for accelerating ion beams and a grounded electrode plate with plural holes corresponding to the holes of the acceleration electrode plate mounted next to the acceleration electrode plate in the outlet of the chamber, characterized in that every hole of the extraction electrode plate is equipped with a Wien filter including a pair of electrodes for generating a static electric field perpendicular to an axial direction of the holes and a pair of magnetic poles for generating a static magnetic field perpendicular both to the axial direction and to the direction of electric field and only such ions with a certain mass that have passed through the holes of the extraction electrode plate can pass through the holes of the next acceleration electrode plate.

A conventional ion source has in general three electrode plates with holes, i.e. a plasma electrode plate, an acceleration electrode plate and a grounded electrode plate. The plasma electrode plate is biased with high voltage being the same as the voltage of the chamber. The acceleration electrode plate is biased with negative low voltage. The grounded electrode plate is grounded.

The present invention adds an extraction electrode plate and Wien filters mounted to the holes of the extraction electrode plate. Thus, a feature of the invention is the Wien filters of the holes for separating ions by their mass by the actions of electric field and magnetic field which are perpendicular each other. The Wien filters will separate ions by their mass. A Wien filter is known as a device for separating ions by mass. However, conventional Wien filter was a single, individual device for mass separation of ion beams with high energy. Such a conventional Wien filter used to be mounted at a passage of ion beams which have passed through the last grounded electrode plate.

However, this invention makes use of many Wien filters installed at all the holes of the extraction electrode plate for mass separation of ion beams with low energy before acceleration.

The holes for ion beam passages of four electrode plates, i.e. plasma electrode plate, extraction electrode plate, acceleration electrode plate and grounded electrode plate are perforated at the same positions of the large area type surfaces of the electrode plates. Therefore, a set of four holes of the four electrode plates are aligned along an axial line perpendicular to the plates, because four electrodes are installed in parallel with each other at the outlet of the ion source chamber. However, each diameter of the holes in a set of the electrode plates is not necessarily equal. Therefore, only the ions which have passed through the holes of the extraction electrode plate toward the axial direction without being bent by the Wien filters of the holes, can pass through a series of holes of the acceleration electrode plate and the grounded electrode plate. On the contrary, the ions which have passed the holes of the extraction electrode plate with being bent by the Wien filters, cannot pass through the succeeding holes of the acceleration electrode plate and the grounded electrode plate, because they collide with the surface either of the acceleration electrode plate or the grounded electrode plate.

Ions pass through the holes of the extraction electrode plate with the same energy which is equal to the potential difference between the voltage of the plasma electrode plate and the voltage of the extraction electrode plate. Since the ions passing through the holes of the extraction electrode plate have the same kinetic energy, only such ions with a certain mass can pass straight through the holes. The ions which have heavier mass than the predetermined mass will be bent to some direction. The ions which have lighter mass than the predetermined mass will be also bent to the other direction by the Wien filters. Such ion beams with heavier mass or lighter mass cannot pass through the holes of the acceleration electrode plate or the grounded electrode plate.

Every Wien filter generates a static electric field E perpendicular to the axial line of the hole and a static magnetic flux B perpendicular both to the axial line (the direction of the ion movement) and to the electric field. The velocity of an ion is denoted by "w".

The ions which pass straight through the holes have the velocity w which satisifies the equation, $$Bw = E \quad (1)$$

The energy of ions at the extraction electrode plate is denoted by $qV_\square$, where q is electric charge and $V_\square$ is the voltage between the plasma electrode plate and the extraction electrode plate. M is mass of the ion. The velocity w of ions is given by $$w = (2qV_\square/M)^{\frac{1}{2}} \quad (2)$$

Accordingly, in order to separate such ions having a certain mass M from other ions having other mass, the electric field E and the magnetic flux B should be determined to satisfy Eq. (1) and Eq. (2).

This invention provides Wien filters at the extraction electrode plate where the energy of ions is still low. The low energy of ions allows low electric field E of the Wien filters. Low electric field simplifies the structures of the electrode plates and of the supporting insulators. Such simplified Wien filters are easy to produce.

The Wien filter installed at the holes of the extraction electrode plate consists of permanent magnets buried on both sides of the hole and a pair of electrodes. The magnets generate a static magnetic field perpendicular to the axial direction. The electrodes form a static electric field perpendicular both to the axial direction and the magnetic field.

In general, the kinetic energy $qV_\square$ of ions is less than 1 keV at the extraction electrode plate. The Wien filters mounted at the holes of the extraction electrode plate separate ions whose energy is less than 1 keV. In many cases, the energy is several hundreds of eV. Low magnetic field and low electric filed are available for mass separation of such ions with low energy. The ions will be accelerated to more than 100 keV by the acceleration electrode plate.

Much stronger electric field and magnetic field would be required for mass-separating the ions with energy of 100 keV by a Wien filter.

The advantage of this invention will be explained. The conventional large area type ion source has no mass separation device. This invention provide a large area type ion source with a mass separation device. The mass separation device prevents impurity ions from being implanted into an object.

Instead of bending wide ion beams as a whole, partial small ion beams passing through a hole are bent independently by a Wien filter installed at the hole. Small magnets and small electrodes are available. The size of a Wien filter is very small because of low electric field, low magnetic field and small diameters of the partial ion beams. However, since this invention makes use of many Wien filters, many magnets and electrodes are required.

This invention proposes a further improvement of an ion source which has five electrode plates instead of four. A separation electrode plate is added between the extraction electrode plate and the acceleration electrode plate. The separation electrode plate has narrower holes than the acceleration electrode plate to raise the resolution of mass separation.

DETAILED DESCRIPTION OF THE EMBODIMENTS

An ion source introduces material gas into a chamber (11), excites the gas into plasma by electric discharge and pulls ion beams from the plasma by the action of electrode plates.

The electric discharge is either an arc discharge (DC), a glow discharge (DC or AC) or a microwave discharge. In many cases, many permanent magnets are mounted on an outer surface of the chamber in order to form cusp magnetic fields in the chamber.

EMBODIMENT 1

Figure 1:
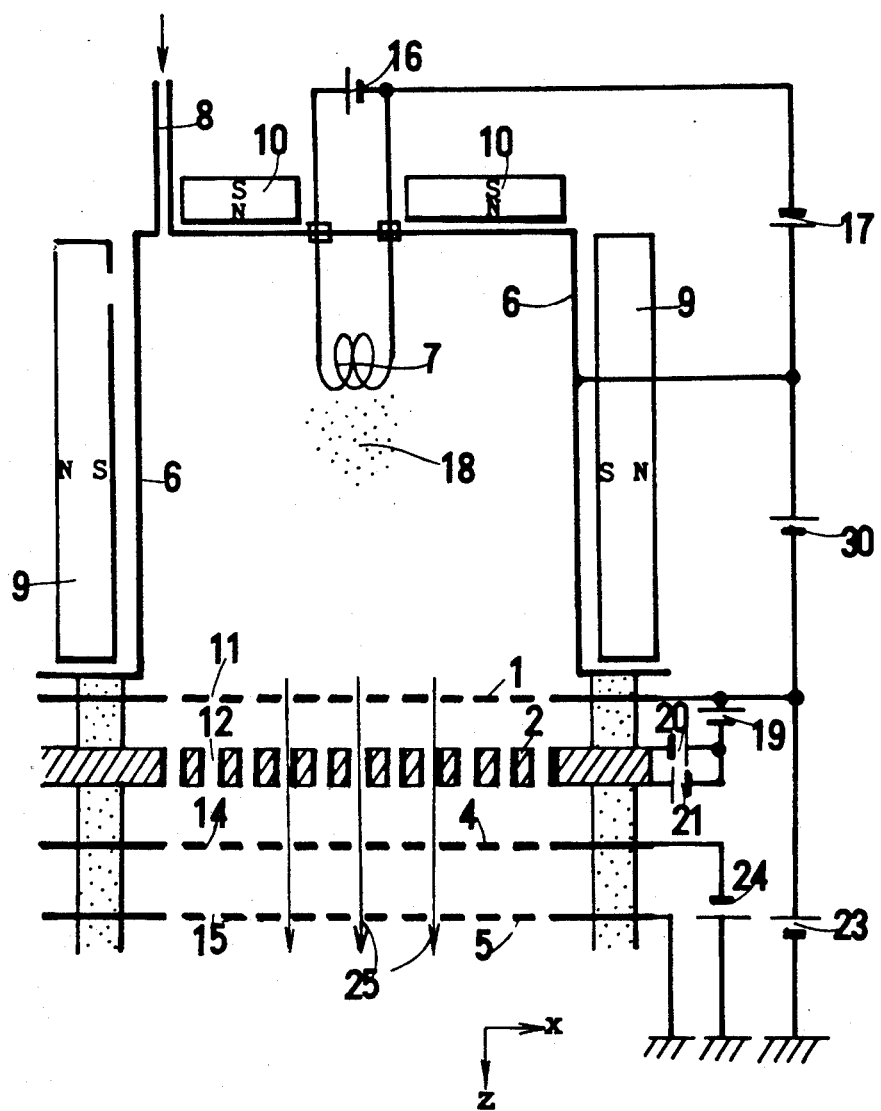
FIG. 1 is a schematic view of an ion source of an embodiment of this invention.

FIG. 1 shows, as an example, a bucket type ion source having a chamber (6) and a filament (7) for inducing an arc discharge between the chamber (anode)(6) and the filament (cathode)(7) and for exciting material gas into plasma by the arc discharge. Since this invention relates only to an improvement of electrode plates, it is able to be applied to the type of ion sources.

The ion source chamber (6) has a gas inlet (8) for introducing material gas and an outlet for exhausting ion beams. Four electrode plates are mounted at the outlet of the chamber (6). The first is a plasma electrode plate (1). The second is an extraction electrode plate (2). The third is an acceleration electrode plate (4). The fourth is a grounded electrode plate (5). These electrode plates (1), (2), (4) and (5) have many ion holes (11), (12), (14) and (15) perforated along the same axial lines. Ion beams can pass through a series of the ion holes (11), (12), (14) and (15). A three-dimensional coordinate is defined here to take xy-planes in parallel with the electrode plates (1), (2), (4) and (5). The ion holes (11), (12), (14) and (15) are aligned in parallel with z-axis. Therefore, only the ion beams which enter the first ion hole (11) and make straight way along the z-direction can pass through all four ion holes (11), (12), (14) and (15).

The plasma electrode plate (1) is biased at the highest voltage. The extraction electrode plate (2) is biased at the second highest voltage. The acceleration electrode plate (4) is biased at a negative voltage. The grounded electrode plate (5) is grounded. A set of the plasma electrode plate (1), the acceleration plate (4) and the grounded electrode plate (5) is the most conventional assembly of electrode plates for ion sources.

However, the extraction electrode plate (2) is novel. Each ion hole (12) of the extraction electrode plate has a Wien filter for mass-separation of ions. This is the most important feature of this invention.

There are many permanent magnets (9) and (10) on the external surface of the chamber (6). The magnets (9) and (10) form cusp magnetic fields in the chamber (6). The cusp magnetic fields prevent plasma (18) from coming into contact with the inner surface of the chamber (6).

The filament (7) is heated by a filament power source (16). Material gas is introduced into the chamber (6) through the gas inlet (8). An arc power source (17) applies positive voltage to the chamber (6) with regard to the filament (7). Thus, a DC voltage is established between the cathode filament (7) and the anode chamber (6). The heated filament (7) emits thermal electrons. The thermal electrons are accelerated by the DC voltage between the filament (7) and the chamber (6). Accelerated electrons collide with neutral gas molecules and excite them into plasma (18). Then an arc discharge is established between the cathode filament (7) and the chamber (6). The material gas is excited into plasma by the DC arc discharge.

A power source (23) biases the plasma electrode plate (1) at positive voltage. A power source (30) biases the chamber (6) further positively to the plasma electrode plate (1). A power source (24) applies a negative voltage to the acceleration electrode plate (4). A power source (19) biases the extraction electrode plate (2) negatively to the plasma electrode plate.

Figure 2:
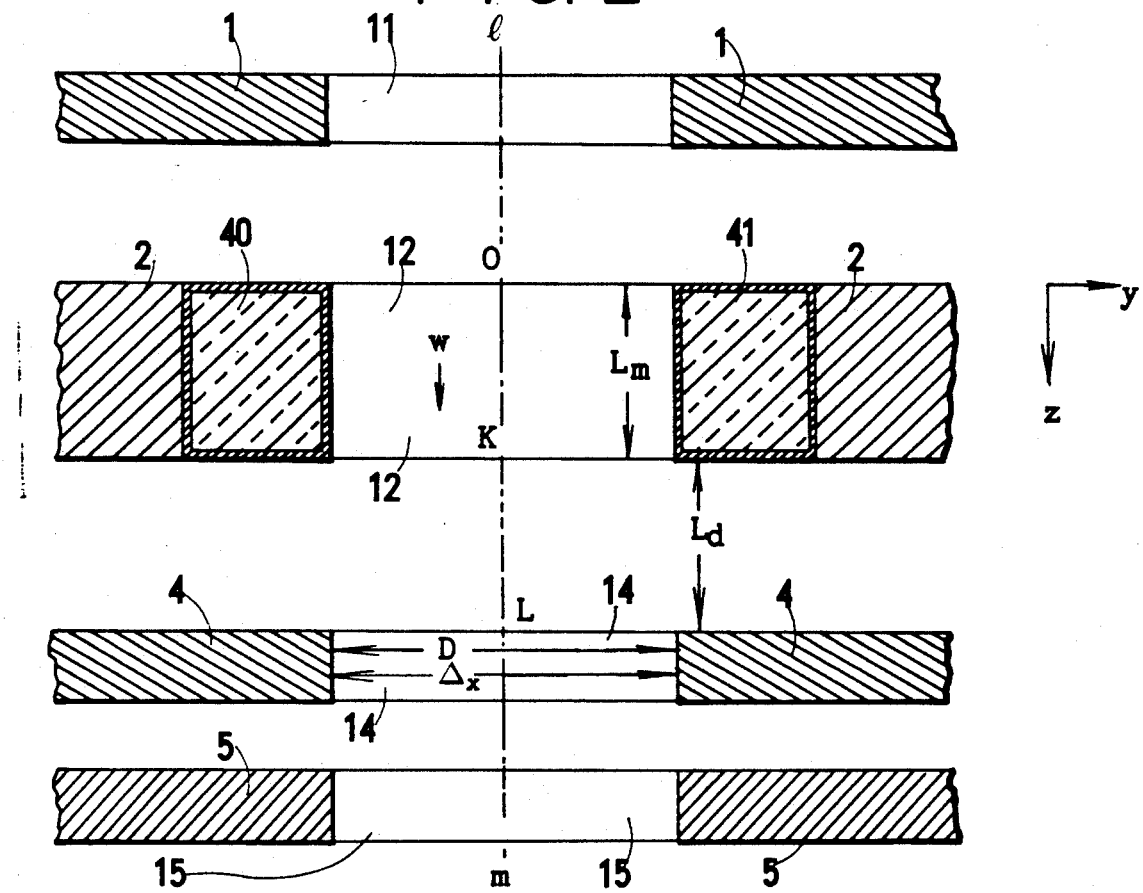
FIG. 2 is an enlarged vertical, sectional view near a series of holes of the electrode plates of FIG. 1.
Figure 3:
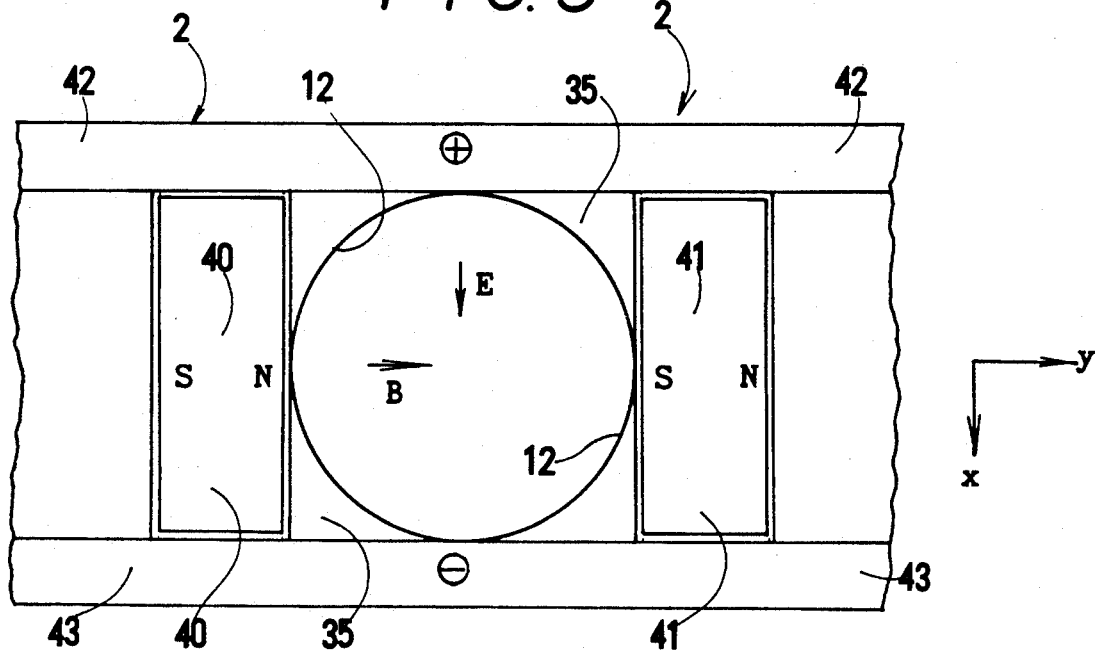
FIG. 3 is a plan view of a part of an extraction electrode near a hole.

Since the feature of this invention is the extraction electrode plate (2) with ion holes (12) having individual Wien filters for mass separation, the ion holes (12) and the Wien filters will be explained by FIG. 2 and FIG. 3.

A Wien filter comprises a pair of permanent magnets (40) and (41) which face each other with different magnetic poles and a pair of parallel electrodes (42) and (43). The permanent magnets (40) and (41) form a static magnetic field in parallel with y-axis. The parallel electrodes (42) and (43) produce a static electric field in parallel with x-axis.

Four corners of the ion holes have corner pieces (35) which are made from non-magnetic material. In the embodiment, the permanent magnets are rectangular magnets. The direction of magnetism is perpendicular to the vertical line of the extraction electrode plate (2). The direction of magnetism is now denoted by y-direction. The magnets (40) and (41) generate magnetic field in y-direction. The parallel electrodes (42) and (43) produce an electric field in x-direction. Ion beams pass in z-direction through the ion holes (12).

A three dimensional coordinate is now defined by taking a central point of the front side of an ion hole (12) of the extraction electrode plate (2) as the original point in order to consider what movement an ion which has passed through the hole (12) will do. A center line 1-m is z-axis. The central point of the rear side of the ion hole (12) is denoted by K. The length of the hole (12), i.e. the thickness of the extraction electrode plate (2), is designated by $L_m$. The central point of the front side of the acceleration electrode plate (4) is denoted by L. D is the diameter of the ion hole (14) of the acceleration electrode plate (4). $L_d$ is the distance between the rear side of the extraction electrode plate (2) and the front side of the acceleration electrode plate (4).

Since a DC voltage is applied between the parallel electrodes (42) and (43), a static electric field E is established in x-direction. Permanent magnets (40) and (41) generate a static magnetic flux B in y-direction.

Velocity components of an ion are expressed by a vector (u,v,w). The static electric field is written as (E, 0, 0). The static magnetic flux is given by (0, B, 0). In the ion hole (7), an ion shall follow the equation of motion;

$$M(du/dt) = qE - qwB \tag{3}$$

$$M(dv/dt) = 0 \tag{4}$$

$$M(dw/dt) = quB \tag{5}$$

A complex variable $\zeta$ is defined by $\zeta = u + iw$. Eq.(3) and Eq. (5) can integrally be expressed by, $$M(d\zeta/dt) = qE + iqB\zeta \tag{6}$$

where M is the mass of the ion and q is the electric charge of the ion. Solution of Eq. (6) is given by, $$\zeta = (iE/B) + C\exp(i\omega t) \tag{7}$$

$$\omega = (qB/M) \tag{8}$$

If initial conditions are imposed by $u = u_\square$ and $w = w_\square$ at $t = 0$, the velocity components u and w are, $$u = u_\square \cos\omega t - \{w_\square - (E/B)\}\sin\omega t \tag{9}$$

$$w = (E/B) + u_\square \sin\omega t + \{w_\square - (E/B)\}\cos\omega t \tag{10}$$

"$x_\square$" denotes x at $t = 0$. The displacement x is obtained as, $$x = x_\square + (u_\square/\omega)\sin\omega t - \}w_\square - (E/B)\}(1 - \cos\omega t)/\omega \tag{11}$$

Eq. (9) teaches us that an ion will make a straight way without being bent in the ion hole (12) under the condition.

$$w_\square = (E/B) \tag{12}$$

This is identical to Eq. (1). Eq. (2) makes the straight-pass condition relevant to the ion energy qEd and the ion mass M.

Substituting $t = L_m/w_\square$, we obtain the velocity u and the displacement x at the outlet ($x = L_m$) of the Wien filter. A dimensionless parameter $\beta$ is defined by, $$\beta = \omega L_m/w_\square \tag{13}$$

u and x are written in brief as, $$u = u_\square \cos\beta - \{w_\square - (E/B)\}\sin\beta \tag{14}$$

$$x = x_\square + (u_\square/\omega)\sin\beta - \{w_\square - (E/B)\}(1 - \cos\beta)/\omega \tag{15}$$

If we wished to obtain rigorous, statistical efficiency of the Wien filter, we should investigate whether an ion having $x = x_\square$ and $u = u_\square$ at $t = 0$ could pass through the next ion hole of the acceleration electrode plate or not, taking the distributions of $x_\square$ and $u_\square$ into account. However, such estimation would be too difficult. For simplicity only the mass dispersion of ion beams having $x_\square = 0$ and $u = 0$ at $t = 0$ were considered. Since ion energy is still low at the extraction electrode plate (2), such assumption can not be so unrealistic.

In brief, approximation of $\sin\beta = \beta$ is now employed, because $\beta$ is much less than 1 ($0 < \beta << 1$). The displacement of the ion at the front surface of the acceleration electrode plate (3) is now denoted by X.

$$X = - \{w_\square - (E/B)\}(1 - \cos\beta)/\omega - \tag{16}$$
$$\{w_\square - (E/B)\} + L_d\sin\beta/w_\square$$
$$\approx - \{w_\square - (E/B)\}\{(L_d + L_m/2)\omega L_m\}/w_\square^2 \tag{17}$$

Since ion energy is the same despite the difference of mass, because the energy of acceleration before the extraction electrode plate is the same. Thus, z-component $w_\square$ of the initial velocity is solely determined by the mass M. Then, such an ion which satisfies the condition $w_\square = E/B$ is designated by $M_\square$. $M_\square$ is the mass of the ions whose beams are required to treat objects. Other ions whose mass is not $M_\square$ should be eliminated before reaching objects. In order to estimate the performance of mass separation, the deviation of an ion whose mass deviates by $\delta M$ from $M_\square (M = M_\square + \delta M)$ at the front surface of the acceleration electrode plate (4) will be now calculated. For such ions, the equation $w_\square = E/B$ does not hold. $w_\square$ deviates from $E/B$ (constant value) by some amount in proportion to mass difference $\delta M$.

$$w_\square - (E/B) = \{2qV_\square/(M_\square + \delta M)\}^{\frac{1}{2}} - (2qV_\square/M_\square)^{\frac{1}{2}} \tag{18}$$
$$\approx - (2qV_\square)^{\frac{1}{2}}\delta M/(2M_\square^{3/2}) \tag{19}$$

Substituting Eq.(19) into Eq.(17), we obtain the displacement X of the ion.

$$X = (\delta M \omega L_m)(L_d + L_m/2)/(2M_\square w_\square) \tag{20}$$

Here, the definition of the variables is now recited in order to deter the significance of equations from being ambiguous. $\delta M$ is the difference of mass, $\omega$ is an angular cyclotron frequency of the ion, $L_m$ is the length of the ion hole (12) and $L_d$ is the distance from the rear surface of the extraction electrode plate to the front surface of the acceleration electrode plate. $M_\square$ is the standard, reference mass. $w_\square$ is an initial velocity of the ion. Eq.(20) teaches that such ions with the mass bigger than $M_\square(\delta M > 0)$ will deviate from the axial line to the plus x-direction ($x > 0$) at the acceleration electrode plate (4) and other ions with the mass lighter than $M_\square(\delta M < 0)$ will deviate from the axial line to the minus x-direction ($x < 0$). The displacement is in proportion to the substantial length ($L_d + L_m/2$) of free flight of ion, in proportion to the length $L_m$ of the Wien filter but in reverse proportion to the mass $M_\square$ or the velocity $w_\square$.

The diameter of the next ion hole (14) of the acceleration electrode plate (4) is denoted by $\Delta_x(=D)$. An ion which has flown along the central line OK through the Wien filter can pass through the hole (14) of the acceleration electrode plate (4), if $|X| < \Delta_x/2$. Since some portions of ion beams flow near the side wall of the filter holes (12), $|X| < \Delta_x$ is the general condition for passing through the ion holes (14) of the acceleration plate (4). Then substitution of x with $\Delta_x$ gives us the formula of resolution power of the Wien filter.

$$(M_\square/\delta M) = (\omega L_m)(L_d + L_m/2)/(2\Delta_x w_\square) \tag{21}$$

Resolution power, electric field or magnetic field will be considered by referring to two examples.

EXAMPLE 1

| | |
|---|---|
| Energy at the extraction electrode plate | $qV_\square = 1$ keV |
| Diameter of ion holes of the extraction electrode plate | $\Delta_x = 2$ mm |
| Length of ion holes of the extraction electrode plate | $L_m = 20$ mm |
| Distance between the extraction electrode and the acceleration electrode | $L_d = 20$ mm |

The reference mass $M_\square$ is 31. The desired ion is a single-charged phosphorus ion $P^+$. The initial velocity $w_\square$ is calculated as, $$w_\square = 7.86 \times 10^4 \text{ m/sec}$$

These parameters determine the resolution power as a function of magnetic flux $$M_\square/\delta M = 5.9 \times B \tag{22}$$

The relation between E and B is $$E = 7.86 \times 10^4 B \tag{23}$$

(i) $^{31}$P and $^{52}$Cr: is mixed in the ion beams of $^{31}$P. In order to separate $^{52}$Cr ions from $^{31}$P ions, the resolution power shall be at least $$M_\Box/\delta M = 31/(52-31) = 1.48 \quad (24)$$

Eq.(22), Eq.(23) and Eq.(24) determine the magnetic flux B and the electric field E for the resolution power.

$$B = 0.25 \text{(Tesla)} \quad (25)$$

$$E = 1.97 \times 10^4 \, V/m \quad (26)$$

(ii) $^{31}$P and $^{28}$N$_2$: $^{28}$N$_2$ is mixed in the ion beams of $^{31}$P. $^{28}$N$_2$ is more difficult to separate by mass than $^{52}$Cr because of smaller difference of mass. The resolution power shall be at least, $$M_\Box/\delta M = 31/(31-28) = 10.3 \quad (27)$$

Therefore, Eq.(22), Eq.(23) and Eq.(27) produce $$B = 1.7 \text{(Tesla)} \quad (28)$$

$$E = 1.37 \times 10^5 \, V/m \quad (29)$$

EXAMPLE 2

| | |
|---|---|
| Energy at the extraction electrode plate | $qV_\Box = 100$ eV |
| Diameter of ion holes of the extraction electrode plate | $\Delta_x = 2$ mm |
| Length of ion holes of the extraction electrode plate | $L_m = 20$ mm |
| Distance between the extraction electrode and the acceleration electrode | $L_d = 20$ mm |

The reference mass $M_\Box$ is 31. The desired ion is also a single-charged phosphorus ion P$^+$.

$$M_\Box/\delta M = 18.7 \times B \quad (30)$$

The relation between E and B is $$E = 2.49 \times 10^4 B \quad (31)$$

(i) $^{31}$P and $^{52}$Cr: Separation of $^{31}$P from $^{52}$Cr requires resolution power $M_\Box/\delta M$ of at least 1.48. Therefore, the magnetic flux B and the electric field E are calculated as $$B = 0.079 \text{(Tesla)} \quad (32)$$

$$E = 1.97 \times 10^3 \, V/m \quad (33)$$

(ii) $^{31}$P and $^{28}$N$_2$: Separation of $^{31}$P from $^{28}$N$_2$ corresponds to the resolution power of 10.3.

$$B = 0.551 \text{(Tesla)} \quad (34)$$

$$E = 13.7 \times 10^7 \, V/m \quad (35)$$

These examples show the strengths of the electric field and the magnetic flux are little. This is mainly because the ion energy is low enough at the Wien filters. This invention separates ions by mass before being accelerated enough. The energy of ions at the extraction electrode plate is less than 1 keV. In usual cases, the energy is as low as 100 eV. Mass separation of ion beams with low energy requires a low magnetic flux and a low electric field.

EMBODIMENT 2

Embodiment 1 has drawbacks. The extraction electrode plate (2) is biased with a high positive voltage. The next acceleration electrode plate (4) is biased with a negative voltage. The voltage drop between the extraction electrode plate (2) and the acceleration electrode plate (4) is considerably large. Thus, the ions which have been accelerated therebetween and have collided with the acceleration electrode plate (2) have large kinetic energy. For example, the bias of the electrodes plates is assumed to be

| | |
|---|---|
| plasma electrode plate | 10 kV |
| extraction electrode plate | 9.6 kV |
| acceleration electrode plate | −0.5 kV |
| grounded electrode plate | 0 kV |

In this case, the ions whose mass is less than $M_\Box$ (under-weight) or more than $M_\Box$ (overweight) will collide with the acceleration electrode plate with the high kinetic energy of 10.5 keV. The bombardments of overweight or under weight ions generate a lot of secondary electrons from the acceleration electrode plate. The secondary electrons induce a parasitic discharge between the acceleration electrode plate and the extraction electrode plate. The discharge will perturb the biases of the electrode plates, dissipate electric power and excite unnecessary ions between the electrode plates. This is a drawback. Therefore, such an occurrence of parasitic discharge shall be avoided.

Another defect is low resolution power. Since ions are accelerated to z-direction by the electric field between the extraction electrode plate (2) and the acceleration electrode plate (4). Even off-axis ions which have flown along skew directions will pass through the ion holes (14) of the acceleration electrode plate (4) by the attraction force of the acceleration electrode plate. Namely, even overweight ions or underweight ions will be able to pass through the ion holes (14). The focussing function of the strong electric field produced between the extraction electrode plate and the acceleration electrode plate deteriorates resolution power. An embodiment with high resolution power being immune from the occurrence of secondary electrons will now be proposed.

Figure 4:
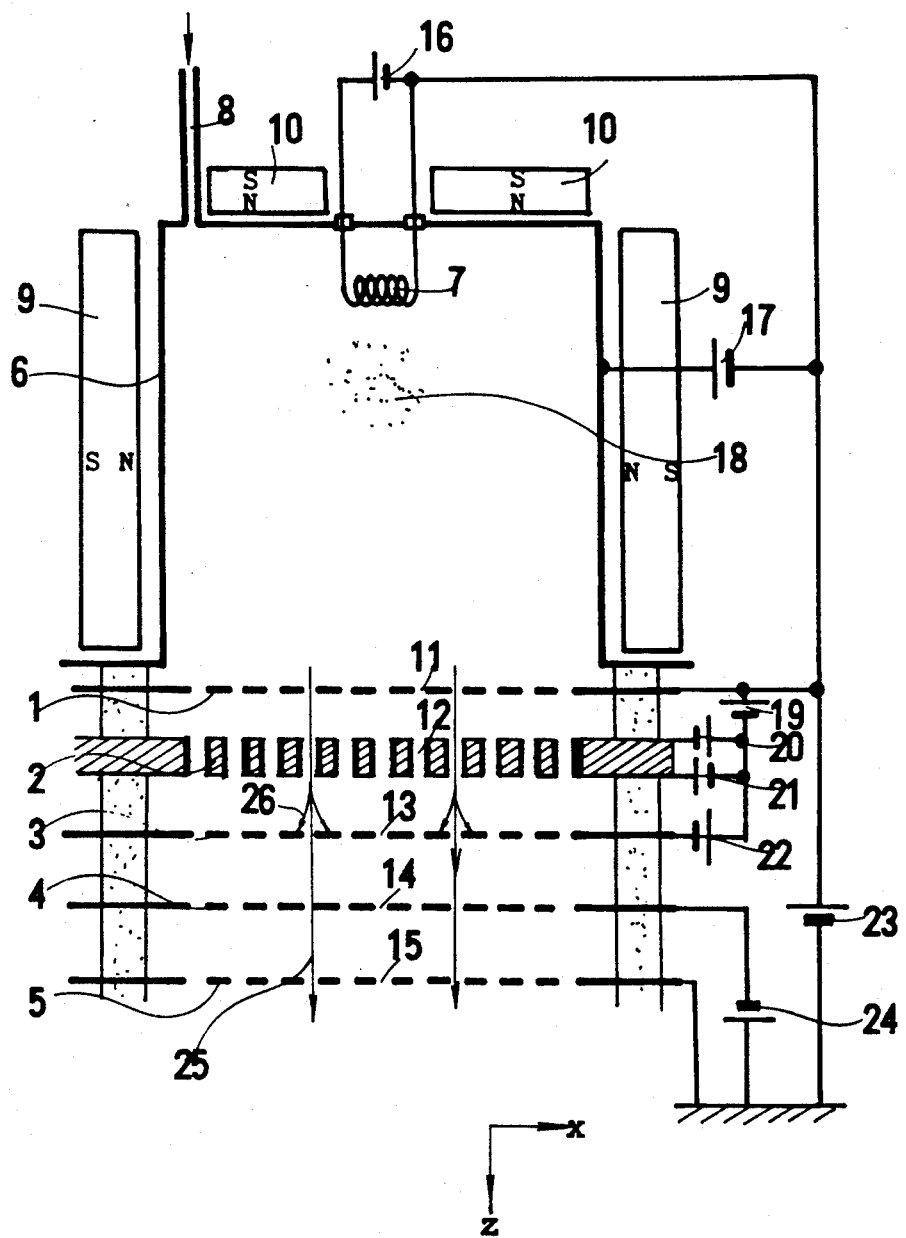
FIG. 4 is a schematic view of an ion source of another embodiment of this invention.
Figure 5:
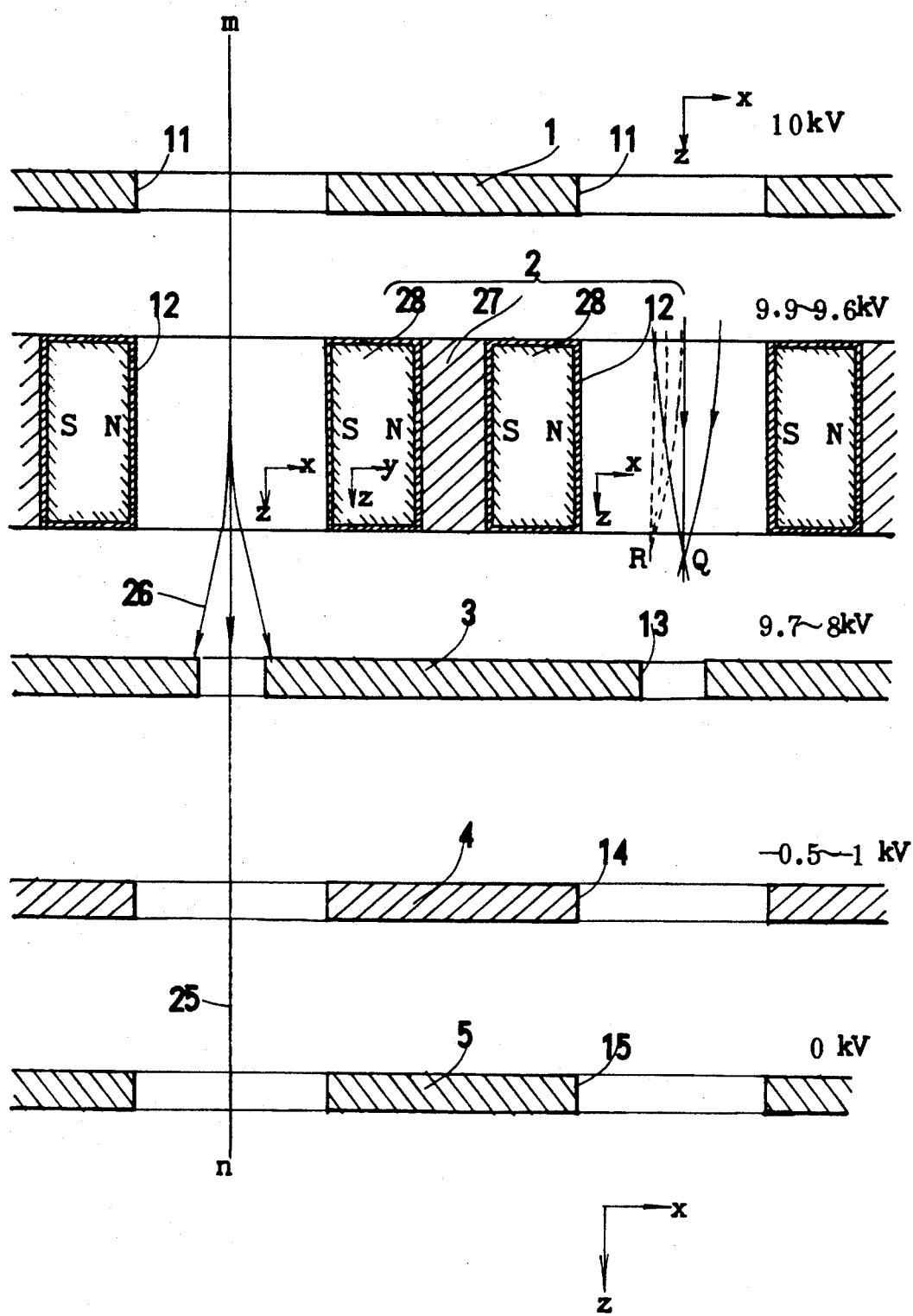
FIG. 5 is an enlarged, vertical sectional view near two series of holes of the electrode plates of FIG. 4.
Figure 6:
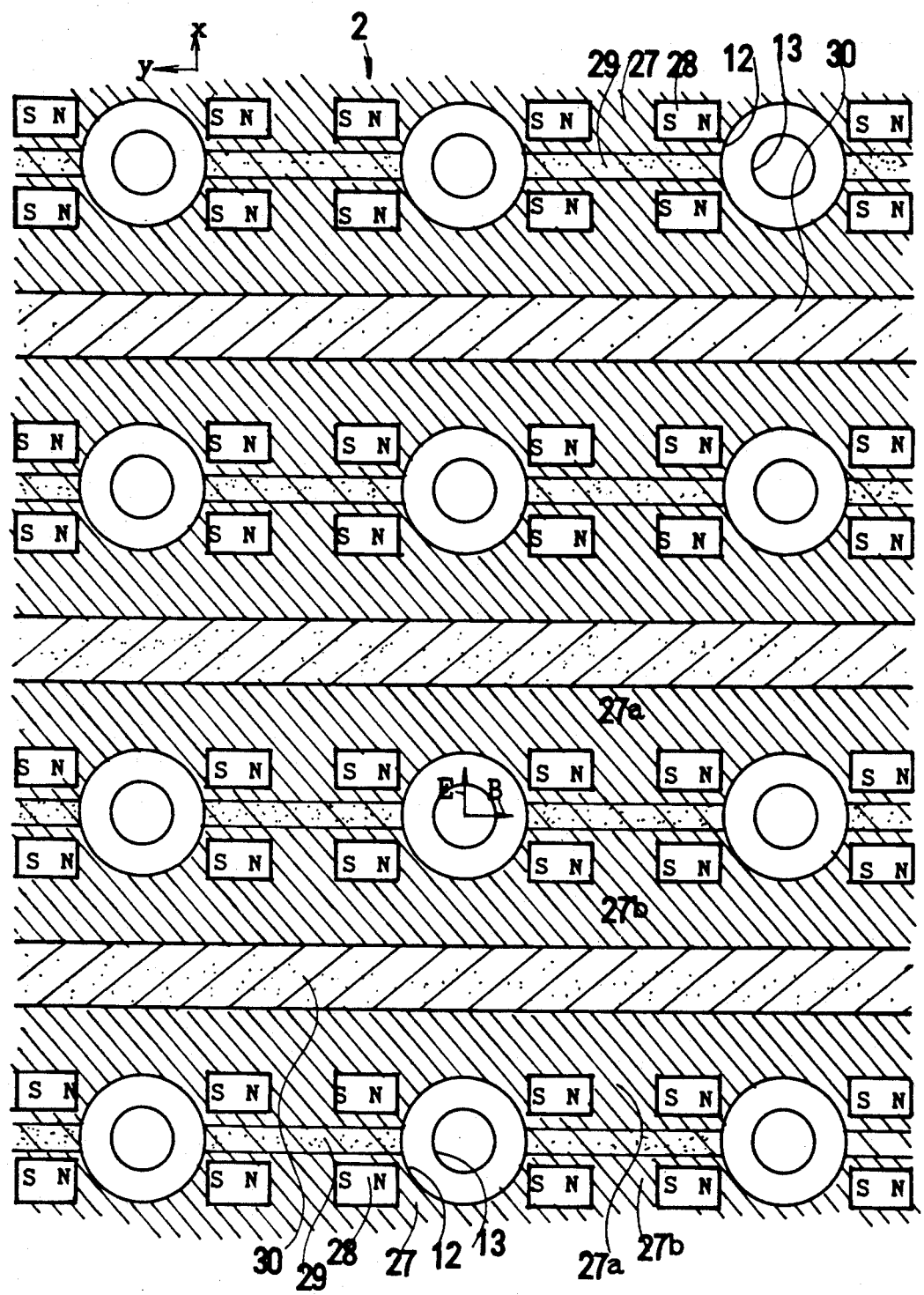
FIG. 6 is a horizontal sectional view of a part of an example of the extraction electrode plate.

Embodiment 2 has five electrode plates, i.e. a plasma electrode plate (1), an extraction electrode plate (2), a mass-separation electrode plate (3), an acceleration electrode plate (4) and a grounded electrode plate (5). FIG. 4 shows the schematic view of embodiment 2. FIG. 5 shows the sectional view of the electrode plates. FIG. 6 shows a plan view of the extraction electrode plate. Embodiment 2 has five electrode plates instead of four electrode plates. The mass-separation electrode plate (3) is newly introduced in embodiment 2.

Five electrode plates (1) to (5) are in parallel installed at the outlet of the ion source chamber (6). They have a lot of ion holes perforated perpendicularly to the surface. The ion holes of all electrode plates (1) to (5) are aligned along with parallel axial lines. The newly-introduced mass-separation electrode plate (3) has smaller ion holes than the extraction electrode plate (2). Unlike the acceleration electrode plate (4), the mass-separation electrode plate (3) is applied with positive high voltage slightly lower than the bias of the extraction electrode plate (2). Thus, ions are not accelerated so fast between the extraction electrode plate (2) and the mass-separation electrode plate (3).

Like embodiment 1, the chamber (6) has an filament (7) which is heated by a filament power source (16). The chamber (6) can be made vacuum by a vacuum pump. Material gas is introduced through a gas inlet (8). Permanent magnets (9) and (10) are installed on the outer wall of the chamber (6) in order to form cusp magnetic field in the chamber.

The chamber (6) is positively biased by an arc power source (17) with regard to the filament (7). The arc power source (17) induces arc discharge between the chamber (anode)(6) and the filament (cathode)(7). The DC arc discharge excites the material gas into plasma. Five electrode plates (1) to (5) are mounted at the outlet of the chamber (6). The plasma electrode plate (1) is positively biased by a power source (23). However, the voltage of the plasma electrode plate (1) is slightly lower than that of the chamber (6).

The extraction electrode plate (2) is biased by a power source (19) slightly lower than the plasma electrode plate (1). The extraction electrode plate (2) has a lot of Wien filters at the ion holes. As a Wien filter requires two different voltage levels, two reversely biasing power sources (20) and (21) are provided in common to the Wien filters.

The mass-separation electrode plate (3) is biased slightly lower than the extraction electrode plates (2). The acceleration electrode plates (4) is biased with negative voltage. The grounded electrode plate (5) is grounded (V=0).

For example, the biases of the electrode plates are settled as;

| | |
|---|---|
| plasma electrode plate | 10 kV |
| extraction electrode plate | 9.9~9.6 kV |
| mass-separation electrode plate | 9.7~8.0 kV |
| acceleration electrode plate | −0.5~−1 kV |
| grounded electrode plate | 0 V |

Namely, ions have low energy and low speed till they have passed through the ion holes of the mass-separation electrode plate (3). Ions are mainly accelerated between the mass-separation electrode plate (3) and the acceleration electrode plate (4).

Each ion hole of every electrode plate is aligned along a central line m-n. The ion holes (12) of the extraction electrode plate (2) are provided with Wien filters. A Wien filter consists of four permanent magnets (28) and a pair of common electrodes (27a) and (27b). In FIG. 6, the ion holes aligned in y-direction have common electrodes (27a) and (27b). (27b) is positively biased by the power source (21). (27a) is negatively biased by the power source (20). Thus, static electric field E is generated in x-direction. Two electrodes (27a) and (27b) belonging to the same Wien filters are separated in the middle by insulators (29). Neighboring electrodes (27a) and (27b) belonging to different Wien filters are separated in the middle by another insulator (30). The insulators (29) and (30) effectively prevent electric field from inducing discharge between the electrodes (27a) and (27b).

Four permanent magnets (28) are aligned in the same direction. They form magnetic field in the ion holes in y-direction. The electric field (x-direction) and the magnetic field (y-direction) of the Wien filter give opposite forces to the ions flying in z-direction. Such an ion with reference mass $M_\square$ having a certain velocity $w_\square = E/B$ can pass straightly through the Wien filter, because the opposite forces are exactly balanced. Overweight ions with lower speed bend to the direction of the electric field. Underweight ions with higher speed bend to the direction reverse to the electric field. Such bent ion beams (26) collide with the mass-separation electrode plate (3) and lose their energy. Thus, underweight ions and overweight ions are eliminated from the ion beams. The ion holes (13) of the mass-separation electrode plate (3) is smaller than that of the extraction electrode plate (2). Thus, the smaller ion holes (13) are seen behind the bigger ion holes (12) in FIG. 6. The smaller ion holes improve the resolution power of the Wien filters. This is one advantage of embodiment 2.

The other advantage is no occurrence of secondary electrons at the mass-separation electrode plate, because ions have insufficient energy at the mass-separation electrode plate (3) because of the small difference of voltage between the extraction electrode plate (2) and the mass-separation electrode plate (3). Thus, no parasitic discharge occurs between the extraction electrode plate and the mass-separation electrode plate.

EMBODIMENT 3

Figure 7:
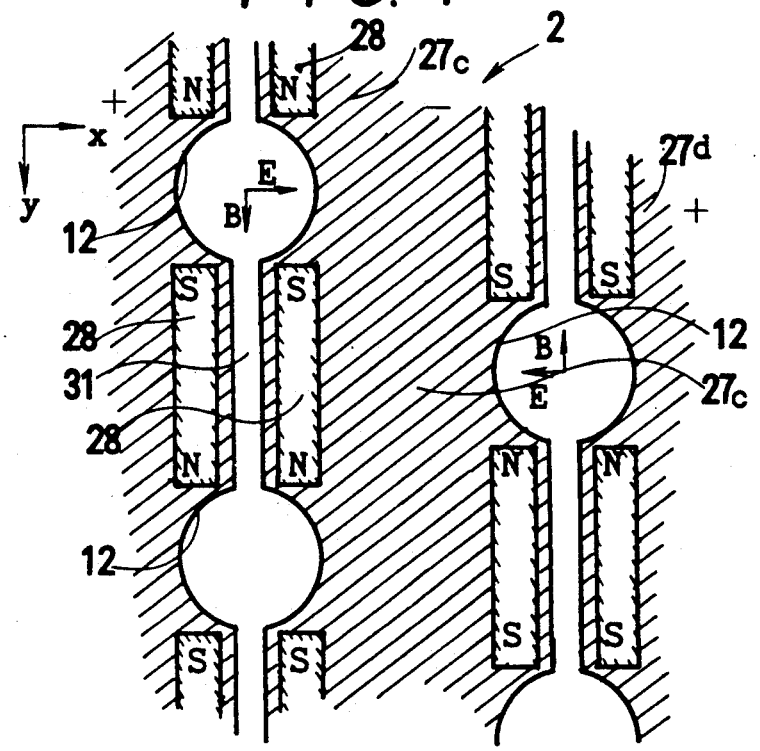
FIG. 7 is a horizontal sectional view of a part of another example of the extraction electrode plate.

FIG. 7 exhibits embodiment 3. Ion holes are disposed at corners of a regular triangle. Electrodes (27) of neighboring Wien filters are unified unlike embodiments 1 and 2. The left electrode is positively biased. The middle electrode (27c) is negatively biased. The right electrode (27d) is positively biased. Therefore, the direction of the electric field changes in x-direction periodically. Therefore, the magnetic field must also change in x-direction. In the first column, the magnetic field is directed to minus y-direction. In the second column, it is directed to plus y-direction. Both the electric field and the magnetic field change in x-direction. Embodiment 3 simplifies the structure of electrodes (27) by reducing the number of electrode to half. In the example, gaps (31) of electrodes are not filled with insulators.

EMBODIMENT 4

Figure 8:
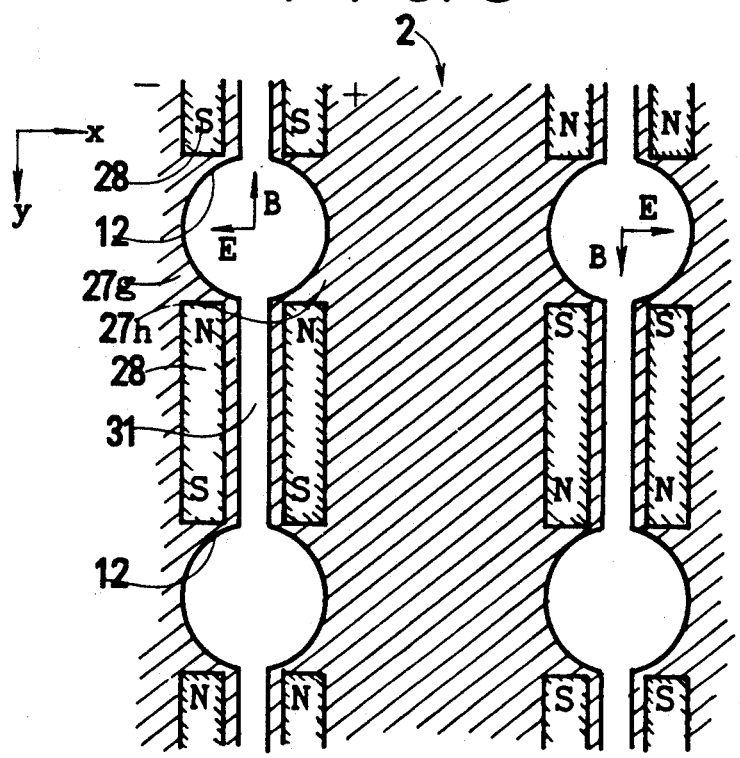
FIG. 8 is a horizontal sectional view of a part of third example of the extraction electrode plate.

FIG. 8 shows another embodiment. The ion holes are arranged periodically like lattice work. The electrodes (27g) are unified with regard to neighboring columns of Wien filters. Thus, the periodicity of the electrodes is twice as long as embodiment 2. The number of permanent magnets is also reduced to half. Two parallel magnets belong to neighboring Wien filters in the same column. The directions of permanent magnets are the same in the Wien filters in the same column. However, the direction of permanent magnet changes in x-direction. Embodiment 4 can also simplify the structure of electrodes. The directions of the magnetic field and the electric field change in x-direction.

Directions of bending of underweight ions or overweight ions are different in the Wien filters aligned in x-direction.

EMBODIMENT 5

Figure 9:
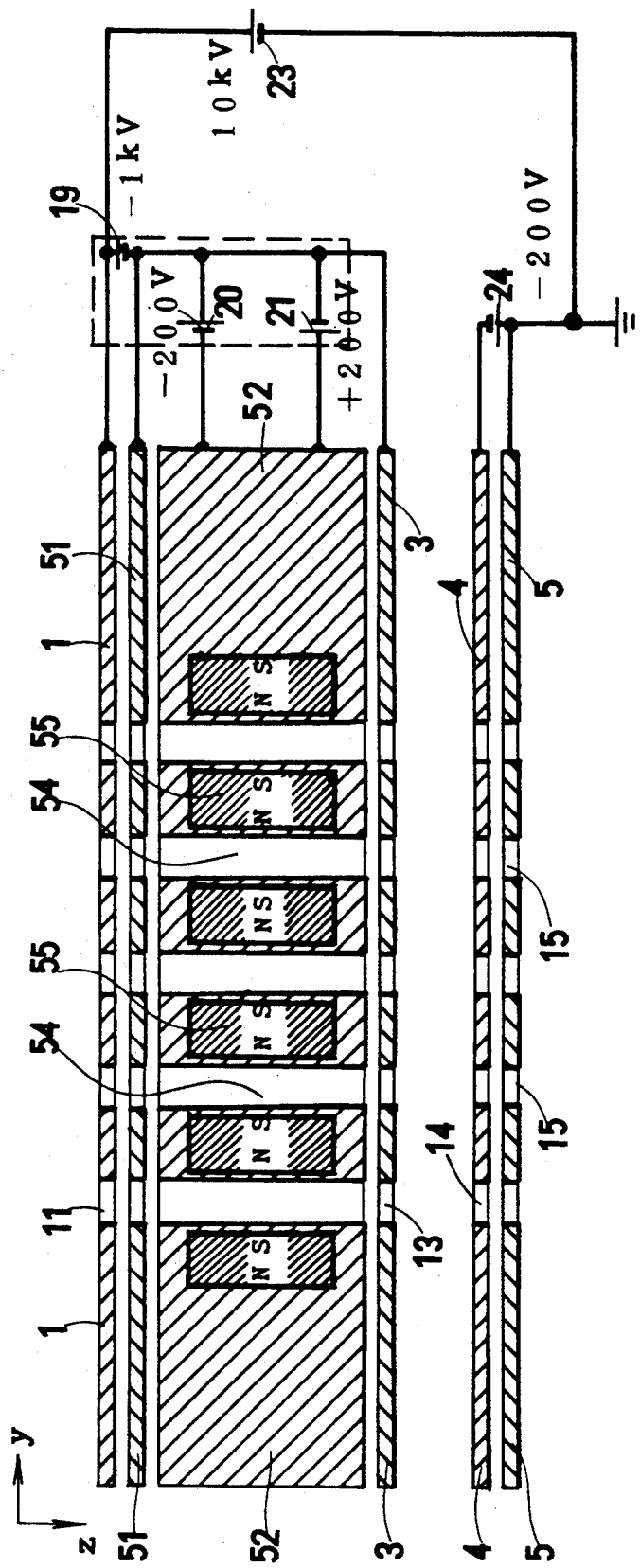
FIG. 9 is a vertical, sectional view of the electrode of third embodiment of this invention.
Figure 10:
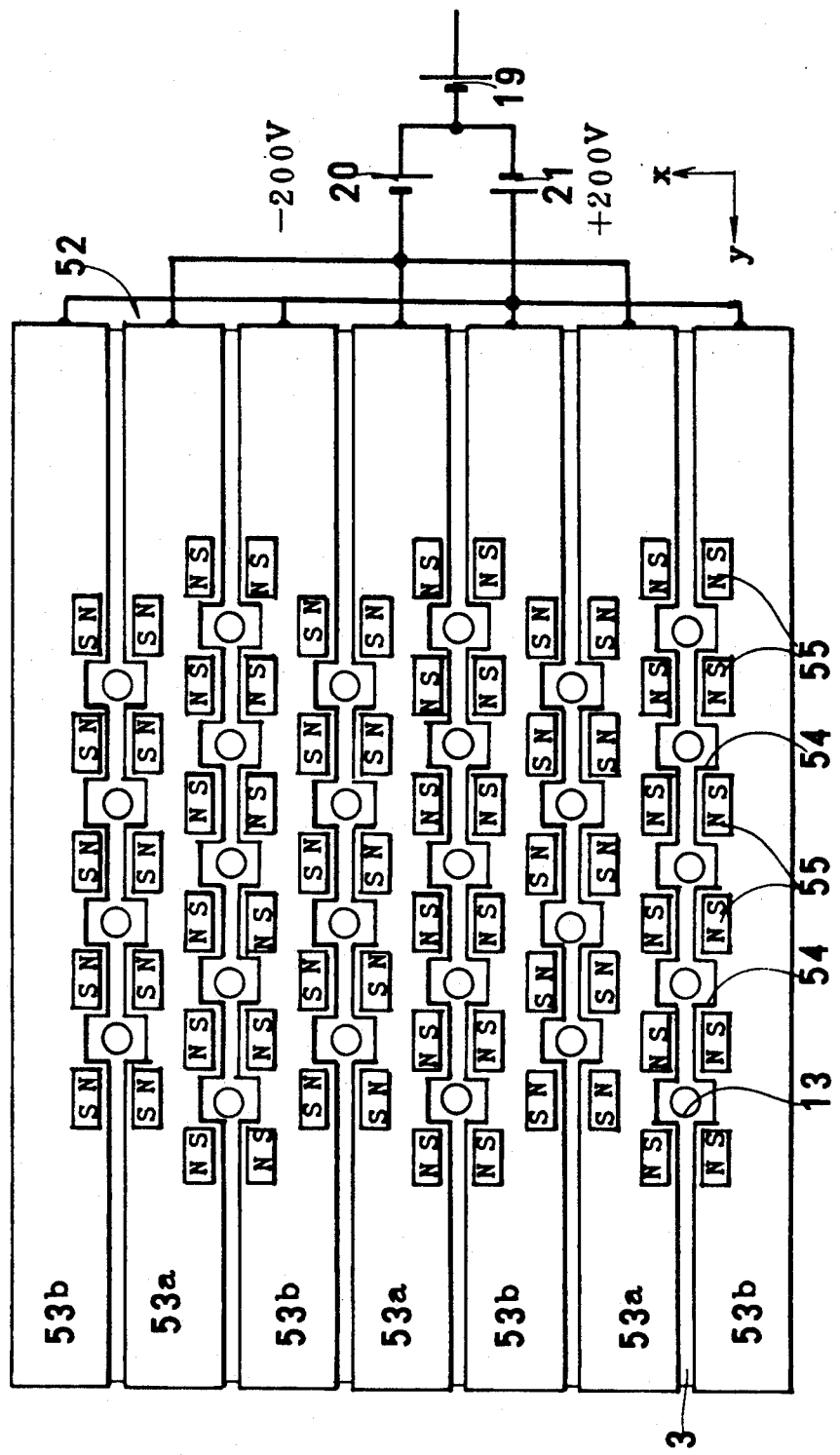
FIG. 10 is a plan view of the extraction electrode of FIG. 9.

FIG. 9 and FIG. 10 show another embodiment. Like embodiments 3 or 4, the electrodes of neighboring columns of Wien filters are unified. Thus, the directions of magnetic field of the Wien filters of the same column are the same. However, the directions of the magnetic field change in the neighboring columns. The ion holes of the extraction electrode plate are not circular but square in the embodiment. One set of electrodes is biased at minus 200 V, and the other set of electrodes is biased at plus 200 V. The disposition of the electrodes and the permanent magnets are similar to embodiment 3 shown in FIG. 7. However, embodiment 5 has six electrode plates. The electrode plates are a plasma electrode plate (1), a pulling-out electrode plate (51), a filter electrode plate (52), a mass-separation electrode plate (3), an acceleration electrode plate (4) and a grounded electrode plate (5). Namely, the extraction electrode plates (2) of embodiment 1 to 5 have been divided into the pulling-out electrode plate (51) and the filter electrode plate (52). Although the pulling-out electrode plate plays the same role as the extraction electrode plate regarding the electrostatic action to ions, one of the divided electrode plate is called as pulling-out electrode plate in order to avoid confusion. The square ion holes of the filter electrode plates improve the distribution of electric field in the holes. Circular ion holes would disturb the electric field near the electrodes. In order to make uniform, parallel electric field, the square ion holes are more appropriate than circular ion holes. The other electrode plates, i.e. the plasma electrode plate (1), the pulling-out electrode plate (51), the mass-separation electrode plate (3), the acceleration electrode plate (4) and the grounded electrode plate (5) have circular ion holes in the example. However, the circular ion holes can be replaced by square ion holes.

In the example, the voltages of the electrode plates are;

| | |
|---|---|
| plasma electrode plate | 10 kV |
| pulling-out electrode plate | 9 kV |
| filter electrode plate | 9 kV |
| mass-separation electrode plate | 9 kV |
| acceleration electrode plate | −0.2 kV |
| grounded electrode plate | 0 V |

The biases of the electrodes of the filter electrode plate are +200 V and −200 V. The difference of voltage of the filter electrodes is 400 V. Namely, the voltage of the plus electrodes is 9.2 kV. The voltage of the minus electrodes is 8.8 kV. In the example, three electrode plates, i.e. pulling out, filter and mass-separation have the same voltage. However, slight voltage decrease is also allowable between the pulling-out electrode plate and the filter electrode plate or between the filter electrode plate and the mass-separation electrode plate.

Embodiments 1 to 5 have an unified extraction electrode plate (2). In such a disposal of electrodes, the horizontal electric field induced by the filter electrodes (27a) and (27b) is likely to disturb the vertical, pulling electric field between the plasma electrode plate (2) and the extraction electrode plate (3) made by the power source (19). The perturbation of the vertical electric field would induce horizontal (x-direction) aberration of ion beams in front of the extraction electrode plate. Since this embodiment has divided the extraction electrode plate into the pulling out electrode plate and the filter electrode plate, no perturbation of vertical electric field occurs as far as the pulling-out electrode plate. Ion beams can be pulled out straightly by the pulling-out electrode plate (51).

This invention has advantages as follows, (1) So far large area type ion source has no mass-separation device. The inventors have provided large area type ion source with a mass-separation device for the first time.

(2) Since the ion beams pass through multi-type Wien filters before being accelerated, the Wien filters require no high electric field nor high magnetic field. Low electric filed and low magnetic field make the cost of manufacturing Wien filters cheaper.

(3) Instead of a single big magnet which bends ion beams in an arc curve, many small Wien filters are used (multi-type Wien filter). Thus, the small size of individual Wien filter enables us further to reduce the electric field and the magnetic field.

(4) Embodiment 2 has furthermore two advantages, i.e. high resolution power and suppression of parasitic discharge.

(5) Embodiment 5 can pull ion beams in a straight direction perpendicular to the plate by the pulling-out electrode plate, because the extraction electrode plate is divided into the pulling-out electrode plate and the filter electrode plate.

What we claim is:

1. An ion source having a mass-separation device which converts material gas into plasma and exhausts ion beams from the plasma comprising a vacuum chamber having a gas inlet and an ion outlet, a vacuum pump for making the chamber vacuum, a discharge device for generating a discharge in the chamber to excite material gas into plasma, a plasma electrode plate having ion holes and being installed at the outlet of the chamber, the plasma electrode plate being biased at a high positive voltage lower than the voltage of the chamber, an extraction electrode plate having ion holes at the same positions and being installed next to the plasma electrode plate, the extraction electrode being biased at a high positive voltage lower than the voltage of the plasma electrode plate, an acceleration electrode plate having ion holes at the same positions and being installed next to the extraction electrode at the outlet of the chamber, the acceleration electrode plate being biased at a negative small voltage, a grounded electrode plate having ion holes at the same positions as the acceleration electrode plate and being installed next to the acceleration electrode plate at the outlet of the chamber, characterized in that each ion hole of the extraction electrode is provided with a Wien filter including permanent magnets facing each other with different magnetic poles for producing a magnetic field perpendicular to an axial direction of the ion holes and electrodes facing each other and being biased at different voltages for producing an electric field perpendicular both to the magnetic field and to the axial direction, ion beams whose mass is equal to a reference mass $M_□$ make a straight way through the Wien filters of the extraction electrode plate by receiving the same but reverse forces from the electric field and the magnetic field, but other ion beams whose mass is not equal to the reference mass $M_□$ make an arc way through the Wien filters by receiving different, reverse forces from the electric field and the magnetic field, and collide with the next acceleration electrode plate.

2. An ion source as claimed in claim 1, wherein the Wien filter of the ion holes of the extraction electrode plate consists of a pair of permanent magnets aligned on opposite sides of the ion hole with the same direction of the magnetism and a pair of common electrodes aligned on another opposite sides of the hole.

3. An ion source as claimed in claim 1, wherein the difference of voltage between the plasma electrode plate and the extraction electrode plate is less than 1 kV and the kinetic energy of an ion at the Wien filter of the extraction electrode plate is less than 1 keV.

4. An ion source as claimed in claim 3, wherein the discharge device comprises a filament heated for emitting thermal electrons, a DC power source applying positive voltage to the chamber with regard to the filament, and an arc discharge is induced between the chamber and the filament.

5. An ion source as claimed in claim 3, wherein the chamber has permanent magnets on the outer surface in order to form cusp magnetic field working for confining the plasma in the chamber.

6. An ion source as claimed in claim 3, wherein the discharge device comprises a microwave oscillator, and a wave guide for guiding microwave from the microwave oscillator into the chamber, and the microwave introduced into the chamber excites the material gas into plasma.

7. An ion source as claimed in claim 3, wherein the discharge device comprises a microwave oscillator, a wave guide for guiding microwave from the microwave oscillator into the chamber and a coil installed around the outer wall of the chamber for making an axial magnetic field, the axial magnetic field rotates electrons with the same frequency as the microwave, and the microwave excites the material gas into plasma.

8. An ion source having a mass-separation device which converts material gas into plasma and exhausts ion beams from the plasma comprising a vacuum chamber having a gas inlet and an ion outlet, a vacuum pump for making the chamber vacuum, a discharge device for generating discharge in the chamber to excite material gas into plasma, a plasma electrode plate having ion holes and being installed at the outlet of the chamber, the plasma electrode plate being biased at a high positive voltage of the chamber, an extraction electrode plate having ion holes at the same positions and being installed next to the plasma electrode plate at the outlet of the chamber, the extraction electrode being biased at a high positive voltage lower than the voltage of the plasma electrode plate, a mass-separation electrode plate having ion holes at the same positions and being installed next to the extraction electrode plate, the mass-separation electrode being biased at a high positive voltage lower than the voltage of the extraction electrode plate, an acceleration electrode plate having ion holes at the same positions at the mass-separation electrode, and being installed next to the mass-separation electrode at the outlet of the chamber, the acceleration electrode plate being biased at a negative small voltage and a grounded electrode plate having ion holes at the same positions as the acceleration electrode plate and being installed next to the acceleration electrode plate at the outlet of the chamber, characterized in that each ion hole of the extraction electrode plate is provided with a Wien filter including permanent magnets facing each other with different magnetic poles for producing a magnetic field perpendicular to an axial direction of the ion holes and electrodes facing each other and being biased at different voltages for producing an electric field perpendicular both to the magnetic field and to the axial direction, ion beams whose mass is equal to a reference mass $M_0$ makes a straight way through the Wien filters of the extraction electrode plate by receiving the same but reverse forces from the electric field and the magnetic field, but the other ion beams whose mass is not equal to the reference mass $M_0$ make an arc way through the Wien filters by receiving different, reverse forces from the electric field and the magnetic field, and collide with the next mass-separation electrode plate.

9. An ion source as claimed in claim 8, wherein the Wien filter of the ion holes of the extraction electrode plate consists of two pairs of permanent magnets aligned on opposite sides of the ion hole with the same direction of magnetism and a pair of common electrodes aligned on another opposite sides of the hole, the pair of electrodes are separated by an insulator, the electrodes belonging to the neighboring Wien filters in the direction of electric field are separated by another insulator and the directions of electric field and the magnetic field are the same with regard to all Wien filters.

10. An ion source as claimed in claim 8, wherein the Wien filter of the ion holes of the extraction electrode plate consists of half of two pairs of permanent magnets being aligned on opposite sides of the ion hole with the same direction of magnetism and belonging in common to the neighboring Wien filters and half of a pair of electrodes being aligned on opposite sides of the ion holes and belonging in common to all the Wien filters along the line parallel to the magnetic field.

11. An ion source as claimed in claim 9 or 10, wherein the Wien filters are aligned lengthwise and crosswise in the extraction electrode.

12. An ion source as claimed in claim 9, wherein the difference of voltage between the extraction electrode plate and the mass-separation electrode plate is less than 2 kV.

13. An ion source as claimed in claim 12, wherein the difference of voltage between the plasma electrode plate and the extraction electrode plate is less than 1 kV.

14. An ion source as claimed in claim 8, wherein the ion holes of the mass-separation electrode plate are smaller than that of the extraction electrode plate.

15. An ion source having a mass-separation device which converts material gas into plasma and exhausts ion beams from the plasma comprising a vacuum chamber having a gas inlet and an ion outlet, a vacuum pump for making the chamber vacuum, a discharge device for generating a discharge in the chamber to excite material gas into plasma, a plasma electrode plate having ion holes and being installed at the outlet of the chamber, the plasma electrode plate being biased at a high positive voltage lower than the voltage of the chamber, a pulling-out electrode plate having ion having at the same positions as the plasma electrode plate and being installed next to the plasma electrode plate at the outlet of the chamber, a filter electrode plate having ion holes at the same positions as the pulling-out electrode plate and being installed next the pulling-out electrode plate, the filter electrode plate being biased at a high positive voltage equal to or lower than the voltage of the pulling-out electrode plate, a mass-separation electrode plate having ion holes at the same positions as the filter electrode plate and being installed next to the filter electrode plate at the outlet of the chamber, the mass-separation electrode plate being biased at a high positive voltage equal or lower than the voltage of the filter electrode, an acceleration electrode having ion holes at the same positions as the mass-separation electrode plate and being installed next to the mass-separation electrode plate at the outlet of the chamber, the acceleration electrode plate being biased at a negative small voltage, and a grounded electrode plate having ion holes at the same positions as the acceleration electrode plate and being installed next to the acceleration electrode plate at the outlet of the chamber, characterized in that each ion hole of the filter electrode is provided with a Wien filter including permanent magnets facing each other with different magnetic poles for producing a magnetic field perpendicular to an axial direction of the ion holes and electrodes facing each other and being biased at different voltages for producing electric field perpendicular both to the magnetic field and to the axial direction, ion beams whose mass is equal to a reference mass $M_\square$ make a straight way through the Wien filters of the filter electrode plate by receiving the same but reverse forces from the electric field and the magnetic field, but other ion beams whose mass is not equal to the reference mass $M_\square$ make an arc way through the Wien filters by receiving different, reverse forces from the electric field and the magnetic field, and collide with the next mass-separation electrode plate.

16. An ion sources as claimed in claim 15, wherein the filter electrode plate has square ion holes.

17. An ion source as claimed in claim 15, wherein the difference of voltages between the plasma electrode and the filter electrode plate is less than 2 kV.

18. An ion source as claimed in claim 17, wherein the difference of voltage between the filter electrode plate and the mass-separation electrode plate is less than 2 kV.

* * * * *